(12) United States Patent
Starkovich et al.

(10) Patent No.: US 8,808,792 B2
(45) Date of Patent: Aug. 19, 2014

(54) CARBON NANOTUBE CONDUCTOR WITH ENHANCED ELECTRICAL CONDUCTIVITY

(75) Inventors: John A. Starkovich, Redondo Beach, CA (US); Edward M. Silverman, Encino, CA (US); Hsiao-Hu Peng, Rancho Palos Verdes, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 235 days.

(21) Appl. No.: 13/351,759

(22) Filed: Jan. 17, 2012

(65) Prior Publication Data

US 2013/0183439 A1 Jul. 18, 2013

(51) Int. Cl.
| | |
|---|---|
| B05D 5/12 | (2006.01) |
| B05D 7/20 | (2006.01) |
| C23C 14/00 | (2006.01) |
| C23C 14/48 | (2006.01) |

(52) U.S. Cl.
CPC .. B05D 5/12 (2013.01); B05D 7/20 (2013.01); C23C 14/00 (2013.01); C23C 14/48 (2013.01); B05D 2256/00 (2013.01)
USPC ............................ 427/113; 427/117; 427/523

(58) Field of Classification Search
USPC ......................................... 427/113, 117, 523
See application file for complete search history.

(56) References Cited

U.S. PATENT DOCUMENTS

| | | | |
|---|---|---|---|
| 5,059,409 A | 10/1991 | Hung | |
| 6,139,919 A * | 10/2000 | Eklund et al. | 427/430.1 |
| 7,501,650 B2 * | 3/2009 | Park et al. | 257/44 |
| 7,750,240 B2 | 7/2010 | Jiang et al. | |
| 2004/0020681 A1 * | 2/2004 | Hjortstam et al. | 174/102 SC |
| 2006/0057290 A1 | 3/2006 | Glatkowski | |
| 2007/0148962 A1 | 6/2007 | Kauppinen et al. | |
| 2009/0008712 A1 | 1/2009 | Choi et al. | |
| 2009/0027069 A1 | 1/2009 | Barrera et al. | |
| 2009/0035555 A1 | 2/2009 | Brahim et al. | |

(Continued)

FOREIGN PATENT DOCUMENTS

| | | |
|---|---|---|
| CN | 101284664 | 10/2008 |
| JP | 2009001481 | 1/2009 |

(Continued)

OTHER PUBLICATIONS

Lee, R.S. et al; Conductivity Enhancement in Single-walled carbon nanotube bundles doped with K and Br; Letters to Nature; Jul. 1997; pp. 255-257; vol. 388; Macmillan Publishers.

Peigney, A. et al; Specific Surface area of carbon nanotubes and bundles of carbon nanotubes; Carbon 39; 2001; pp. 507-514; Elsevier Science Ltd.

(Continued)

*Primary Examiner* — Brian K Talbot

(74) *Attorney, Agent, or Firm* — Carmen Patti Law Group, LLC

(57) ABSTRACT

A method includes the steps of receiving a conductor element formed from a plurality of carbon nanotubes; and exposing the conductor element to a controlled amount of a dopant so as to increase the conductance of the conductor element to a desired value, wherein the dopant is one of bromine, iodine, chloroauric acid, hydrochloric acid, hydroiodic acid, nitric acid, and potassium tetrabromoaurate. A method includes the steps of receiving a conductor element formed from a plurality of carbon nanotubes; and exposing the conductor element to a controlled amount of a dopant solution comprising one of chloroauric acid, hydrochloric acid, nitric acid, and potassium tetrabromoaurate, so as to increase the conductance of the conductor element to a desired value.

3 Claims, 10 Drawing Sheets

(56) References Cited

U.S. PATENT DOCUMENTS

| | | |
|---|---|---|
| 2009/0218549 A1 | 9/2009 | Kato et al. |
| 2009/0282802 A1 | 11/2009 | Cooper et al. |
| 2010/0035047 A1 | 2/2010 | Ajayan et al. |
| 2010/0272981 A1* | 10/2010 | Rinzler et al. ............... 428/220 |
| 2011/0005808 A1* | 1/2011 | White et al. ............... 174/126.2 |
| 2011/0059317 A1* | 3/2011 | Elhard et al. ............... 428/408 |
| 2011/0095237 A1 | 4/2011 | Liu et al. |
| 2011/0097512 A1 | 4/2011 | Zhou et al. |
| 2012/0141666 A1* | 6/2012 | Yoon et al. ............... 427/108 |

FOREIGN PATENT DOCUMENTS

| | | | |
|---|---|---|---|
| JP | 2009287112 | | 12/2009 |
| KR | 20080001678 | | 1/2008 |
| KR | 20080112799 | | 12/2008 |
| WO | 2008057615 | | 5/2008 |
| WO | 2008091402 | | 7/2008 |
| WO | 2009137722 | | 11/2009 |
| WO | 2012/118836 | * | 9/2012 |

OTHER PUBLICATIONS

Pan, B. et al; Attachment of gold nanoparticles on multi-walled carbon nanotubes; Nanoscience; Original Articles; Jun. 2006; pp. 95-101; vol. 11, No. 2.

Glerup, M. et al; Doping of Carbon Nanotubes; Chapter for Inclusion in forthcoming book Doped Nanomaterials and Nanodevices; Ed. Wei Chen (2007); Chapter 2008; pp. 1-74.

Gravel, E. et al; Chitosan-mediated Synthesis of Carbon Nanotube-Gold Nanohybrids; Science China; Sep. 2010; pp. 2015-2018; vol. 53, No. 9; doi:10.1007/s11426-010-4059-z; Science China Press and Springer-Verlag Berlin Heidelberg 2010.

Harvey, Stefanie; Carbon Nanotube Technology—Q&A with TE Connectivity's Stefanie Harvey; Nov. 5, 2012; pp. 1-4; www.aerospace-technology.com/features/featurecarbon-nanotube-technology-cnt-military/.

Kukowski, Tom et al; CNT Electrical Interconnects WIKI Rev1; Sep. 12, 2012; 9:56 am; pp. 1-3; efile: I:\TomK User File\TomK 12.4.06. mo.7am\Wire\AAAWire DK ina Nutshell\CNT Electrical Interconnects WIKI Rev1.doc.

* cited by examiner

CARBON NANOTUBE CONDUCTOR WITH ENHANCED ELECTRICAL CONDUCTIVITY

BACKGROUND

The invention relates generally to a conductor and more particularly to a carbon nanotube (CNT) conductor with enhanced electrical conductivity.

CNTs are 1-dimensional, nanometer-scale, tubular-shaped graphene molecules that exhibit ballistic semiconducting and metallic electrical conductivity properties at room temperature. CNTs have extremely small size and extremely large specific surface area. CNTs are known to have extraordinary tensile strength, including high strain to failure and relatively high tensile modulus. CNTs may also be highly resistant to fatigue, radiation damage, and heat.

CNTs comprise $sp^2$ covalently bonded carbon atoms in a hexagonal array and have a relatively low density of around 1,400 $kg/m^3$. Due to void volume, spun CNT yarns, braided cable and manufactured sheet products can have densities as much as ⅔ lower than this figure. CNTs may be produced as single- or multi-wall tubular structures by a variety of synthesis methods and can have a length-to-diameter aspect ratio ranging from approximately $10^2$ to $10^8$. Having such a large range of aspect ratios, CNTs may be readily assembled in to strands, threads and yarns, and braided into cables and woven into fabrics much like wool or other macro-scale fibrous materials.

SUMMARY

In one set of embodiments, there is provided a method including the steps of receiving a conductor element formed from a plurality of carbon nanotubes; and exposing the conductor element to a controlled amount of a dopant so as to increase the conductance of the conductor element to a desired value, wherein the dopant is one of bromine, iodine, chloroauric acid, hydrochloric acid, hydroiodic acid, nitric acid, and potassium tetrabromoaurate.

DESCRIPTION OF THE DRAWINGS

The accompanying drawings provide visual representations which will be used to more fully describe various representative embodiments and can be used by those skilled in the art to better understand the representative embodiments disclosed herein and their advantages. In these drawings, like reference numerals identify corresponding elements.

DETAILED DESCRIPTION

Figure 1:
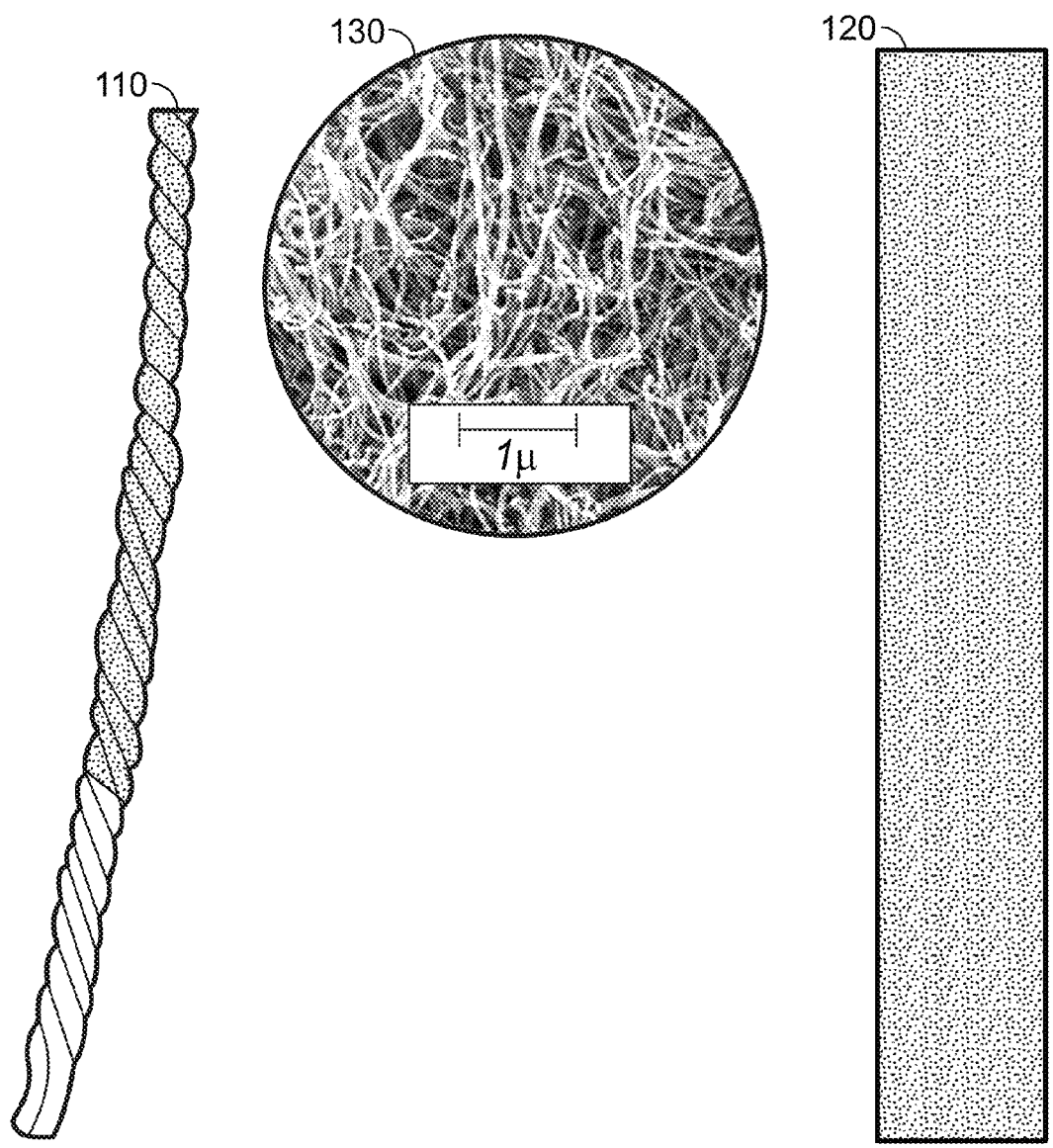
FIG. 1 is a drawing showing a twisted yarn CNT, a nonwoven paper CNT, and a sample microscopic view of a CNT.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

Utilization of conventional metals such as copper and silver for electrical power conductors and signal transmission cables for airborne and space system applications is problematic. These applications, depending on their scale, can require hundreds to several thousand kilometers of wire and cabling and need to be lightweight in order to minimize their impact on overall system performance. While copper and silver exhibit high electrical conductivities (60 and 63 MS/m respectively) and moderate current carrying properties ($10^6$-$10^7$ $A/cm^2$), they are burdened with having high material densities (8,940 and 10,500 $kg/m^3$ respectively), low strain capability, and low tensile and fatigue strengths.

Moreover, due to their macro- or bulk nature (non-nanometer dimension scale), these metal conductors are subject to a "skin effect" which significantly reduces their conductivity properties at high alternating current signal frequencies. These less positive attributes require that bulk metal conductors be used at larger diameter or heavier gauges than otherwise needed and at definitely greater than optimum system weight.

Lighter weight and/or lower density metal conductors such as aluminum and its alloys are used today in many terrestrial applications. Such applications are less critical in the sense that these applications readily permit servicing or replacing of wiring or conductors if they become mechanically broken or if they overheat. While aluminum conductors have similarly high electrical conductivity and are substantially less dense than copper or silver, aluminum wire mechanical properties are markedly inferior and are not generally considered reliable enough for air and space systems. Aluminum conductors—due to their lower strength, fatigue life and service temperature—have not been used for applications requiring ultra-high reliability such as spacecraft for which repair or replacement is not a practical option.

In addition to being lighter weight than copper and silver conductors, CNT conductors exhibit several other advantages over these traditional metal conductors while also avoiding the shortcomings of aluminum conductors. Due to their nanometer-range diameters, CNT conductors exhibit little or no skin effects which make them less lossy at high frequencies and have higher strain capabilities, allowing them to have sharper bend radii for more compact wiring applications. Because of their particular carbon molecular structure, CNTs have lower temperature coefficients of resistivity and thermal expansion, making them more electrically and mechanically stable. CNT conductors represent a lighter weight alternative to heavy copper and silver metal conductors for weight constrained aerospace and defense applications.

Carbon nanotube (CNT) film, filament, yarn, sheet and other bulk material forms may be used for making a variety of conductive films, wire/cable conductors and high specific power thermoelectric devices for airborne and space system applications. However, the electrical conductivity of these CNT materials is not optimum for many of the intended applications. While their theoretical intra-tube, defect-free, ballistic conductance is $4e^2/h$ (155 µS or 1/6.5 kΩ), the conductance of presently synthesized CNTs with multiple growth defects is much lower. Typical untreated macro-scale twisted CNT cable conductors containing defect-laden semiconductor and metallic conducting tubes with multi-inter tube junction contracts exhibit DC conductivities that are 100-fold to 1,000-fold lower than copper.

Moreover, different values of conductivity may be required for different applications. For example, a CNT lightweight electrical power cable requires a conductor with maximum conductivity approaching or better than that of copper or silver (58 MS/m), a static control coating or a transparent conductive film a material requires much lower conductivity perhaps of the order of 100 S/m while a lightweight CNT thermoelectric generator may require a material with some intermediate conductivity in order to maximize thermoelectric power efficiency.

Attempts to achieve a targeted conductance value through adding and/or removing material, electrochemical plating, conductor compression and/or tensioning, and other mechanical means can be difficult to accomplish and can negatively impact conductor strength, flexibility and fatigue or cycle life.

Earlier workers have reported on attempts to improve electrical conductivity by post-CNT-growth treatment procedures including doping. However, such efforts to produce high conductivity CNT conductors have generally been narrowly and academically directed at demonstrating improved direct current (DC) electrical conductivity of individual CNTs or of micro-scale tube bundles.

FIG. 1 is a drawing showing a twisted yarn CNT 110, a non-woven paper CNT 120, and a sample microscopic view of a CNT 130.

Figure 2:
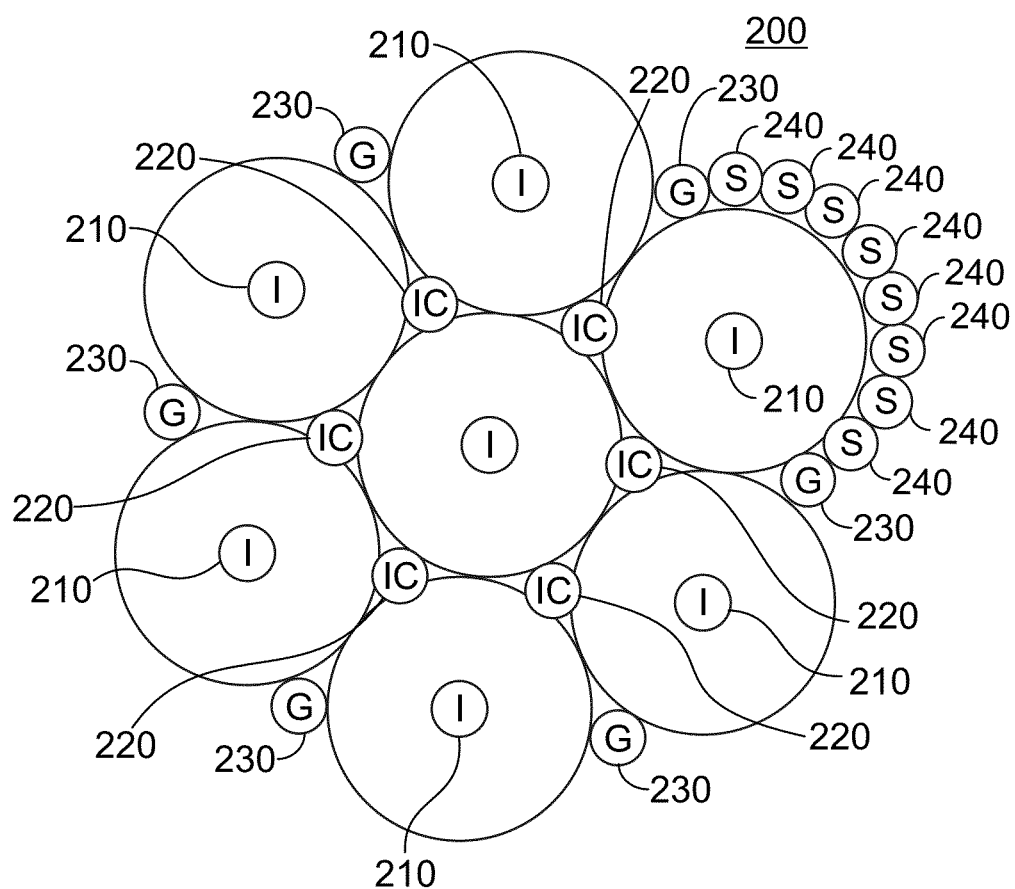
FIG. 2 is a drawing showing CNT bundle doping sites.

FIG. 2 is a drawing showing CNT bundle 200 doping sites, CNT bundle interiors (I) 210, interstitial (IC) dopants 220, groove (G) dopants 230, and CNT surface (S) dopants 240.

The existing post-growth alternatives for controlling CNT conductor conductivity include: (i) introduction of doping agents during CNT growth (in-situ doping), (ii) adding or reducing the size of CNT conductors or the concentration of the conductor in a composite material, and (iii) mechanical compression and/or tensioning of wires and/or cable. Unfortunately, these methods do not provide the flexibility for achieving a targeted conductivity and/or may alter the mechanical properties of the conductor.

Embodiments of the invention solve these problems and shortcomings by enhancing the bulk material's conductivity and/or by allowing an operator to control or tune the conductivity to values required for a particular application.

We have developed methods for substantially improving the electrical conductivity properties of as-produced CNT materials via post-synthesis doping and other treatment methods to achieve a targeted conductance. We have also demonstrated the doped CNTs' thermo-cycle stability and high frequency performance properties, as is required for applications such as aerospace system applications. Lightweight electrical conductors treated according to embodiments of the invention are extremely attractive for use in both commercial and military aircraft and satellites, making them more fuel-efficient and/or enabling larger payloads.

According to embodiments of the invention, a method of treating carbon nanotubes (CNTs) makes it possible to increase their conductance, preferably to a range that is competitive with copper wire and cables. Embodiments of the invention increase the suitability of CNTs for use as electrical power conductors and signal transmission cables, especially in airborne and space system applications in which reducing weight and resistance to temperature strain are important considerations.

75 mm length samples of CNT yarn (Nanocomp Technologies CTex Yarn) were cut from spooled material and their resistances were measured prior to doping treatment. Resistances were measured using a four-point resistance measurement technique employing a Keithley Model 580 Microohmmeter. Triplicate sets of yarn samples were separately treated with solutions of varying concentrations of chloroauric acid or were exposed to bromine vapor for different periods. Additional sets of yarn samples were treated with solutions of hydrochloric acid, hydroiodic acid, nitric acid, and potassium tetrabromoaurate. All solution-treated samples were rinsed with de-ionized water and dried prior to having their resistances re-measured. The resistances of bromine-exposed samples were measured immediately after exposure and were submitted for Energy Dispersive X-ray Analysis for determination of bromine content.

Exposure of CNT yarn or sheet material samples to one of aqueous dopant solution concentrations or gaseous dopants induces different atomic ratios of dopant to CNT carbon in the treated samples. We compared pre-doping and post-doping changes in the resistance of the samples. For each dopant, we conducted five doping tests at five different dopant concentration levels. Atomic concentrations of the doped samples were measured by Energy Dispersive X-ray Analysis and the ratios of dopant atom to carbon were determined. Changes in the resistance and conductivity of the doped samples were computed for the different dopant concentration levels to determine preferential dopant atomic ratios. The results are shown in Table 1.

TABLE 1

SUMMARY OF EXPERIMENTAL RESULTS

| | HAuCl$_4$ Dopant | | | Br$_2$ Dopant | | |
|---|---|---|---|---|---|---|
| | Doping Agent Concentration, Moles/Liter | Post Doping Conductivity, C/C$_o$ | Au Atom % | Br$_2$ Exposure Time, min. | Post Exposure Conductivity, C/C$_o$ | Br Atom % |
| 1 | 0.02 | 1.78 | 0.39 | 1 | 1.94 | 0.49 |
| 2 | 0.05 | 1.77 | 0.39 | 5 | 2.10 | 0.95 |
| 3 | 0.10 | 1.91 | 0.67 | 10 | 2.22 | 1.1 |
| 4 | 0.50 | 1.78 | 0.39 | 30 | 2.64 | 1.7 |
| 5 | 5.0 | 1.94 | 0.35 | 60 | 2.82 | 1.9 |
| 6 | — | — | — | 1,440 | 3.65 | 3.1 |

We discovered that narrow, attractive concentration ranges exist for chloroauric acid (HAuCl$_4$) and molecular bromine (Br$_2$) dopants in enhancing the conductivity of macro-scale CNT material products. Employing particular chemical doping agents such as chloroauric acid and molecular bromine according to embodiments of the invention, DC conductivity of currently produced CNT yarn and cable conductors can be enhanced to a target level. Additionally, according to embodiments of the invention, the DC conductivity of currently produced CNT yarn and cable conductors can be enhanced to within a factor of twenty-fifty times that of copper. Accordingly, CNT conductors created according to embodiments of the invention constitute attractive, light-weight replacements for some signal transmission, data transmission, and shielding applications.

According to embodiments of the invention, carbon nanotubes are received (or created) as a yarn, braided cable, tape, or other woven and nonwoven structures. As one example, non-woven, unoriented random felt may be used. The conductivity of the CNTs is increased, according to embodiments of the invention, through post-synthesis doping. In one set of embodiments, doping is performed using molecular bromine, either in gaseous or liquid form. In another set of embodiments, doping is performed using molecular iodine, either in gaseous or liquid form. In yet another set of embodiments, doping is performed using tetrachloroauric acid. According to still other sets of embodiments, doping is performed using one of chloroauric acid, hydrochloric acid, hydroiodic acid, nitric acid, and potassium tetrabromoaurate.

According to embodiments of the invention, additional optional treatments such as low duty-cycle pulse electroplating and radiation dose exposure can further enhance the conductivity.

As shown in Table 1 and in FIGS. 3-9, we have found that through the use of certain chemical doping agents such as chloroauric acid (HAuCl$_4$) and molecule bromine (Br$_2$) according to embodiments of the invention, the conductivity of bulk CNT conductors can be enhanced in a controlled and predictable fashion. Treatment of CNT yarns with HAuCl$_4$ solutions of widely varying concentrations (0.02 to 5M) enhances conductivity by a nearly constant factor of approximately 1.8.

On the other hand, exposing CNT yarns to Br$_2$ vapor for different time intervals produces a variable conductivity enhancement (C/C$_o$) that is approximately linearly related to the amount of bromine absorbed by the yarn. In the case of Br$_2$ treatment, conductivity enhancement factors of up to approximately forty may be achievable according to embodiments of the invention, depending on the particular type and size of nanotube used in the conductor.

According to embodiments of the invention, CNT powders and their manufactured film, cable, and sheet material forms may be treated with liquid or gaseous doping agents to alter their electrical conductance to particular levels required for specific applications.

We have exclusively shown that by controlling the amount of bromine one can precisely and predictably adjust the conductivity level of bulk CNT conductors. Due to their chemical similarity to bromine, iodine and other halogens probably behave in a similar manner. The linear relationship between Br content and conductivity level suggests that the enhancement effect is associated with accessible tube surface area and unrelated to interaction with tube defects. Observation of a saturation type enhancement effect with HAuCl$_4$ indicates that the doping mechanism involved with this agent differs from that involving bromine and might involve defect decoration/interaction.

Figure 3:
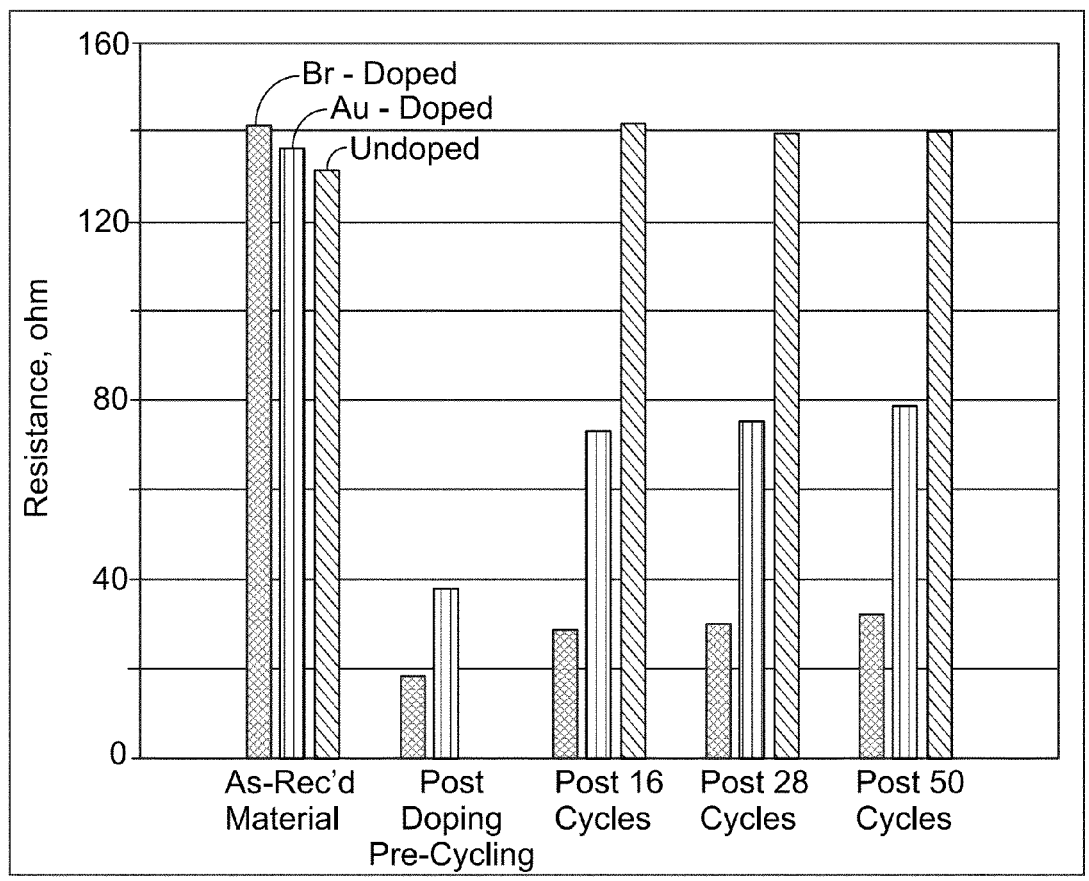
FIG. 3 is a bargraph of the electrical resistance of CNT tape materials as a function of time after various numbers of thermal cycles, each running from −65° C. to 125° C., including as received and immediately post-doping, for CNT tape materials that are undoped, doped with bromine, and doped with chloroauric acid.

FIG. 3 is a bargraph of the electrical resistance of CNT tape materials after various numbers of thermal cycles, each running from −65° C. to 125° C. The results on the graph include CNT tape as received and immediately post-doping, for CNT tape materials that are undoped, doped with bromine, and doped with tetrachloroauric acid.

Prior to thermal cycling, the undoped CNT tape exhibited a resistance of approximately 141 ohms, while the bromine-doped CNT tape had a resistance of approximately 19 ohms and the chloroauric acid-doped CNT tape had a resistance of approximately 37 ohms. The conductivity enhancement (C/C$_o$) prior to thermal cycling is approximately (141/19)=7.4 for bromine-doped CNT tape. The conductivity enhancement (C/C$_o$) prior to thermal cycling is approximately (136/37)=3.7 for chloroauric acid-doped CNT tape.

After 16 thermal cycles, the resistances of all three materials (undoped CNT tape, bromine-doped CNT tape, and chloroauric acid-doped CNT tape) were close to the respective values after 50 thermal cycles, which were 140 ohms, 28 ohms, and 78 ohms.

The conductivity enhancement (C/C$_o$) after 50 thermal cycles is approximately (140/28)=5.0 for bromine-doped CNT tape.

The conductivity enhancement (C/C$_o$) after thermal cycling is approximately (78/37)=2.1 for chloroauric acid-doped CNT tape.

The advantageous effects on conductivity produced by doping treatments employing at least one of bromine and tetrachloroauric acid are evident. These doping treatments reduce the electrical resistance of CNT tape materials and cause a relative improvement in stability after multiple thermal cycles.

Figure 4:
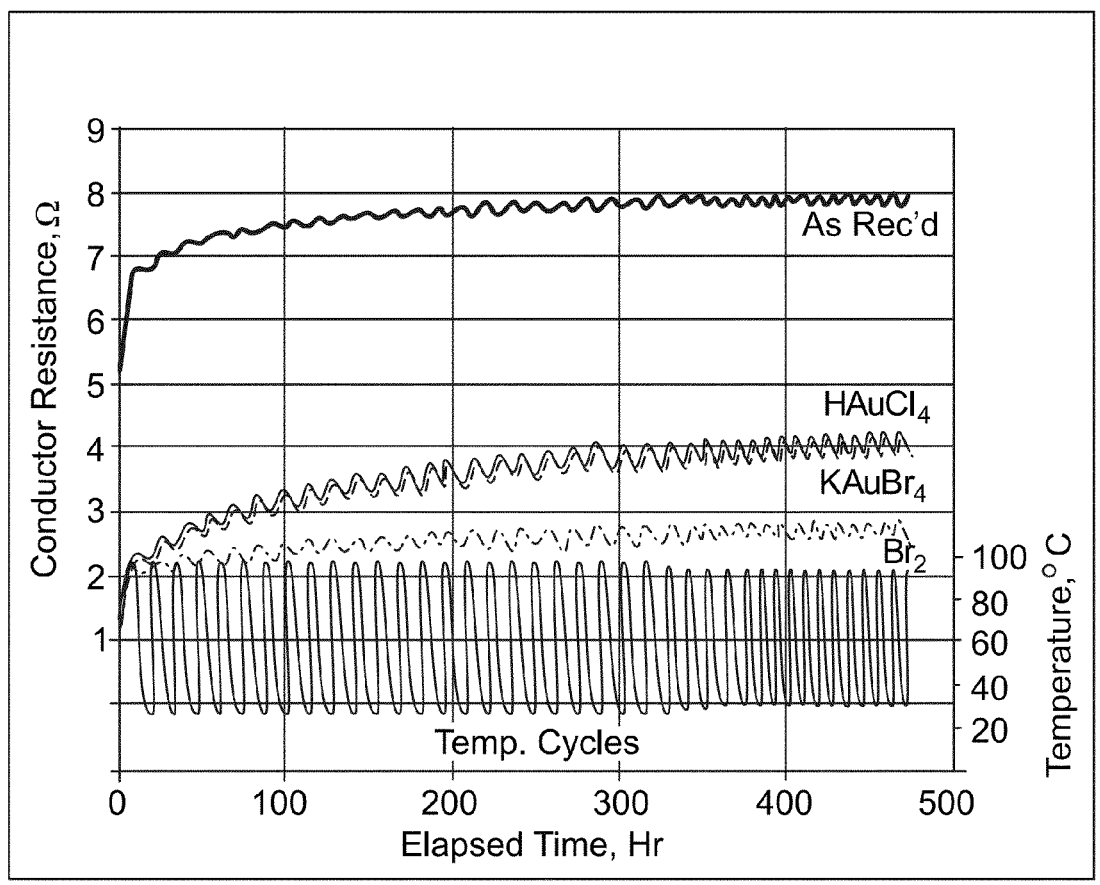
FIG. 4 is a graph of the electrical resistance during temperature cycling of CNT braided cable as received, doped with bromine, doped with potassium tetrabromoaurate, and doped with chloroauric acid.

FIG. 4 is a graph of the electrical resistance during temperature cycling of CNT braided cable as received, as doped with bromine, as doped with potassium tetrabromoaurate, and as doped with chloroauric acid. The particular CNT braided cable used was 28 American Wire Gauge (AWG) braided CNT cable. Other cables that may be used include twisted stranded conductors and shielded conductors.

Even doping with only eight percent by weight of specially plated silver can have a very beneficial effect on enhancing conductance of braided CNT conductors. Experimental results showed a starting conductance of 0.16 mohs and a post-plating conductance of 1.7 mohs, producing an impressive enhancement by approximately a factor of 10.5 while maintaining the lightweight characteristic of the conductor.

After 100 hours, the resistances of all four materials (undoped braided CNT conductors, chloroauric acid-doped braided CNT conductors, potassium tetrabromoaurate-doped braided CNT conductors, and bromine-doped braided CNT conductors) were close to the respective values after 470 hours, which were 8 ohms, 4 ohms, 2.7 ohms, and 2.7 ohms.

The data shown in FIG. 4 are illustrative of the stability of electrical resistance of doped conductors.

According to embodiments of the invention, conductivity may be enhanced by an additional treatment of the conductor element comprising electroplating with silver, wherein the amount of silver used in the electroplating is at least approximately eight percent by weight.

According to embodiments of the invention, an additional treatment of the conductor element comprising electroplating with silver may enhance the conductivity by a factor of at least approximately ten.

Figure 5:
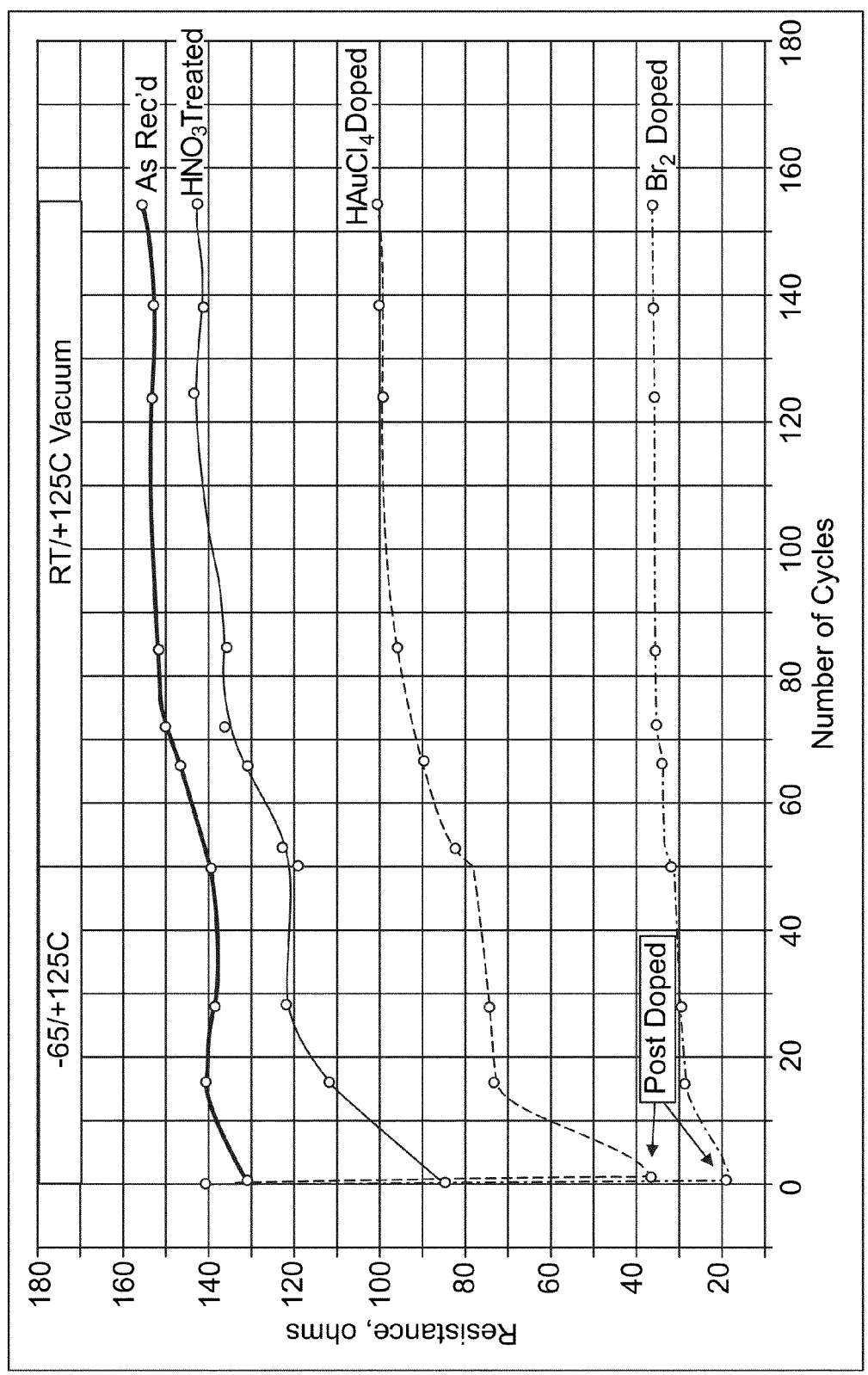
FIG. 5 is a graph of the electrical resistance of CNT sheet material after various numbers of thermal cycles, each running from −65° C. to 125° C., including as received and for CNT sheet material that is doped with nitric acid, with chloroauric acid, and bromine.

FIG. 5 is a graph of the electrical resistance of CNT sheet material showing its stability after various numbers of thermal cycles, each running from −65° C. to 125° C. and in vacuum from room temperature to +125° C., including as received and for CNT sheet material that is doped with nitric acid, with chloroauric acid, and with bromine.

Prior to thermal cycling, the undoped CNT sheet material exhibited a resistance of approximately 130 ohms, while the nitric acid-doped CNT sheet material had a resistance of approximately 85 ohms, the bromine-doped CNT tape had a resistance of approximately 19 ohms and the chloroauric acid-doped CNT tape had a resistance of approximately 37 ohms.

After 80 thermal cycles, the resistances of all four materials (undoped CNT sheet material, nitric acid-doped CNT sheet material, bromine-doped CNT CNT sheet material, and chloroauric acid-doped CNT sheet material) were close to the respective values after 155 thermal cycles, which were approximately 156 ohms, approximately 143 ohms, approximately 37 ohms, and approximately 101 ohms.

Conductivity enhancement ($C/C_o$) results obtained with a representative bulk CNT yarn conductor are summarized in Table 1 and are presented in FIGS. 6-9.

Figure 6:
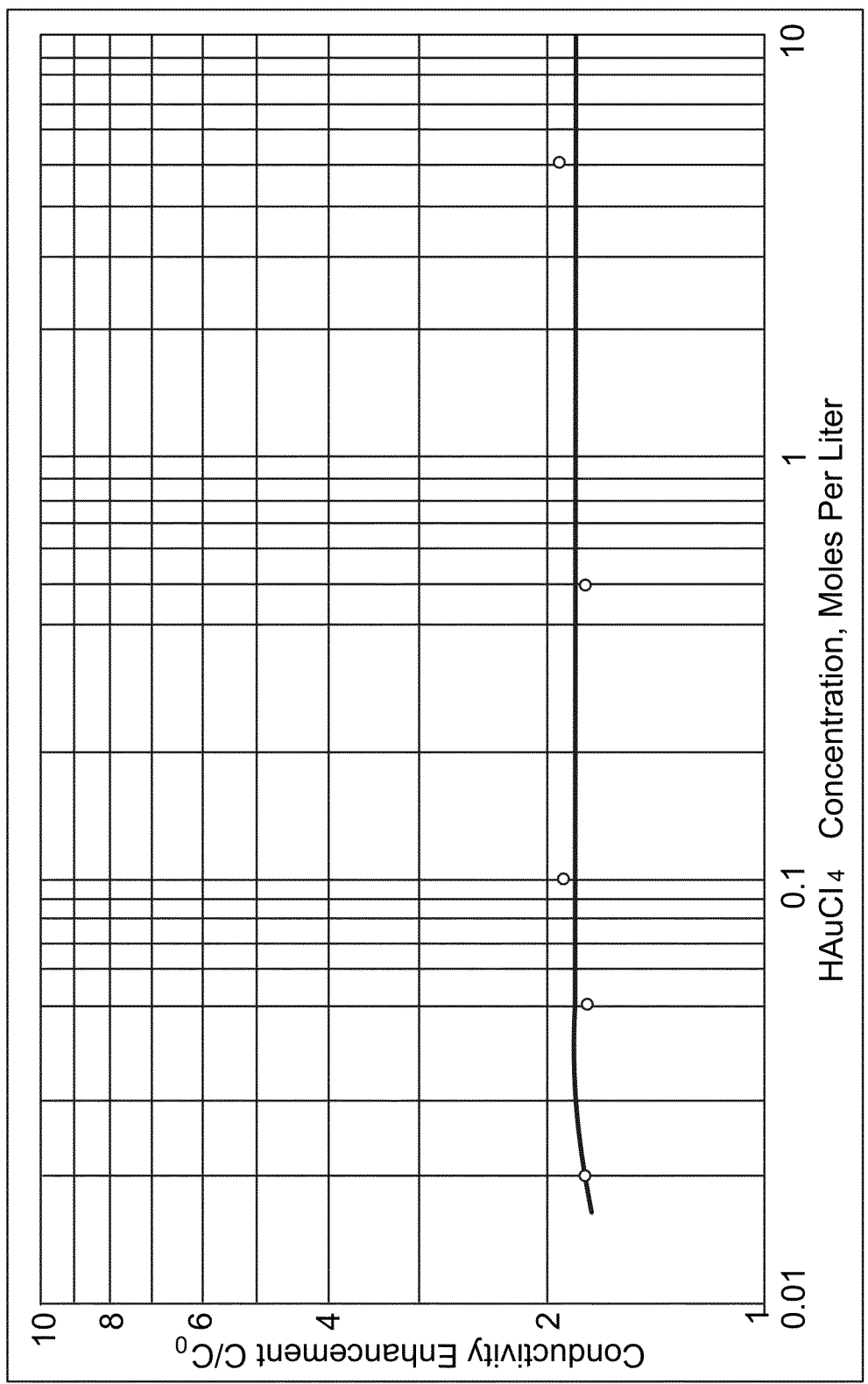
FIG. 6 is a graph of the conductivity enhancement ($C/C_o$) resulting from doping CNT yarn with chloroauric acid as a function of the dopant concentration.

FIG. 6 is a graph of the conductivity enhancement ($C/C_o$) as a function of the dopant concentration resulting from doping CNT yarn with chloroauric acid.

The near constant conductivity enhancement by a factor of approximately 1.8 is achieved with $HAuCl_4$ doping solutions of concentrations ranging from approximately 0.02 moles per liter to approximately 5 moles per liter.

When the dopant comprises chloroauric acid, the conductivity is enhanced by a factor that does not depend on the amount of chloroauric acid dopant.

Figure 7:
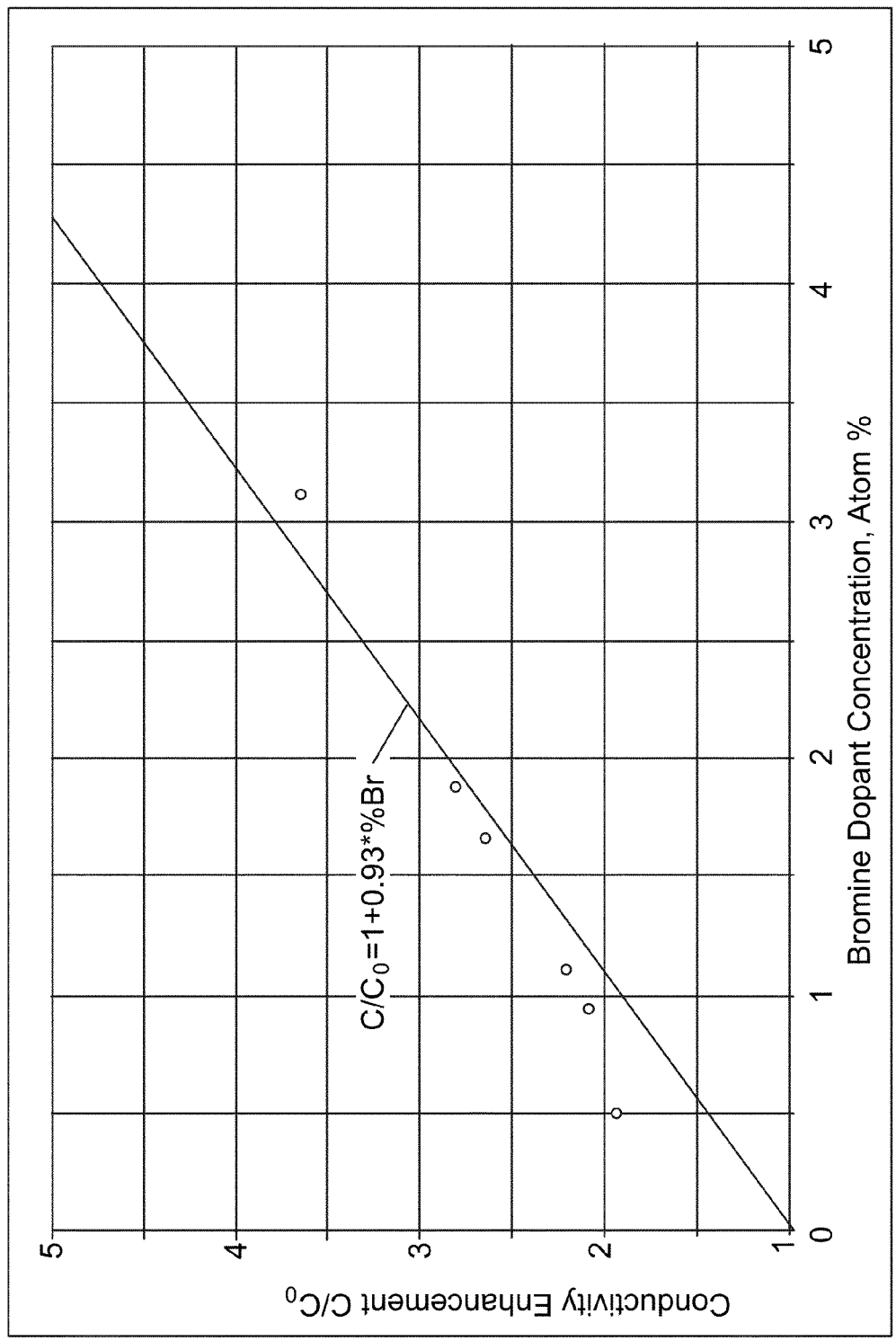
FIG. 7 is a graph of the conductivity enhancement ($C/C_o$) as a function of the dopant concentration resulting from doping CNT yarn with bromine.

FIG. 7 is a graph of the conductivity enhancement ($C/C_o$) as a function of dopant concentration resulting from doping CNT yarn with bromine. As shown in FIG. 7, yarn conductivity increases by over a factor of 3.65 and is approximately linearly related to bromine content up to 3 atom percent, the maximum dopant concentration investigated.

A method includes the steps of receiving a conductor element formed from a plurality of carbon nanotubes; and exposing the conductor element to a controlled amount of a dopant so as to increase the conductance of the conductor element to a desired value, wherein the dopant is bromine, and wherein conductance is enhanced by a factor of approximately 3.65.

An approximate linear relationship between the conductivity enhancement factor and the atomic percentage of bromine dopant may be interpolated from the data. This approximate linear relationship is as follows: ($C/C_o$)=1+0.93*% Br. Conductivity enhancement and Br content are linearly related, while yarn conductivity and Br doping exposure time are nonlinearly related.

Figure 8:
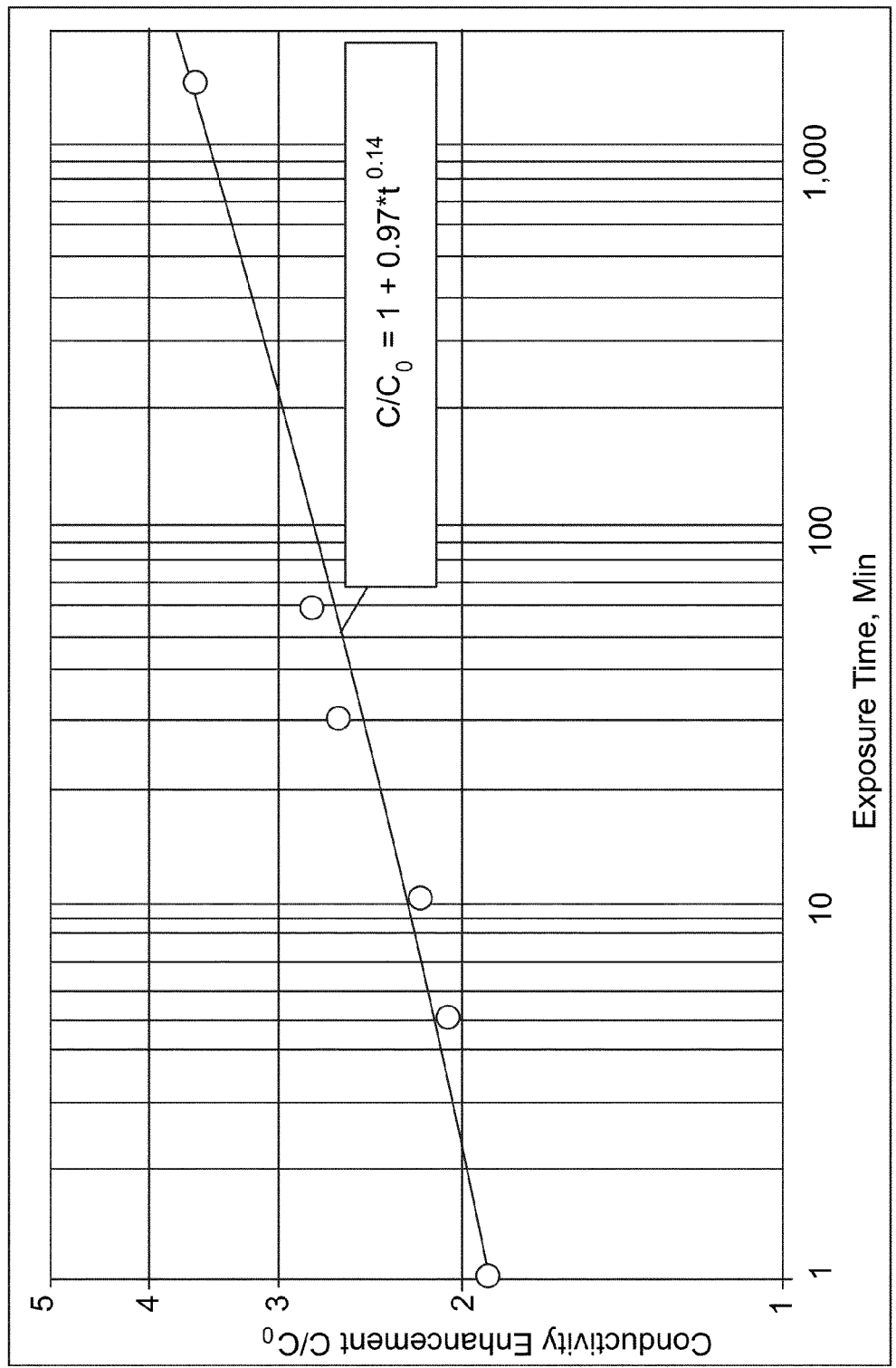
FIG. 8 is a graph of the conductivity enhancement ($C/C_o$) as a function of exposure time resulting from doping CNT yarn with bromine.

FIG. 8 is a graph of the measured conductivity enhancement ($C/C_o$) as a function of exposure time resulting from doping CNT yarn with bromine. An approximate power-law relationship between the conductivity enhancement factor and the time for which the conductor is exposed to the dopant may be interpolated from the data. This approximate power-law relationship is as follows: ($C/C_o$)=1+0.97*$t^{0.14}$, where time t is expressed in minutes.

Accordingly, conductivity enhancement through bromine doping is probably controlled by some type of diffusion-reaction process. Achievement of the 3.65× conductivity enhancement ($C/C_o$) effect required a 24-hour vapor exposure period, which resulted in a residual bromine concentration of 3.1 atom percent in the CNT yarn sample. One needs to be careful in extrapolating conductivity enhancements beyond the range of experimental exposure times and Br concentrations studied since some maximum absorbable concentration levels may exist.

Figure 9:
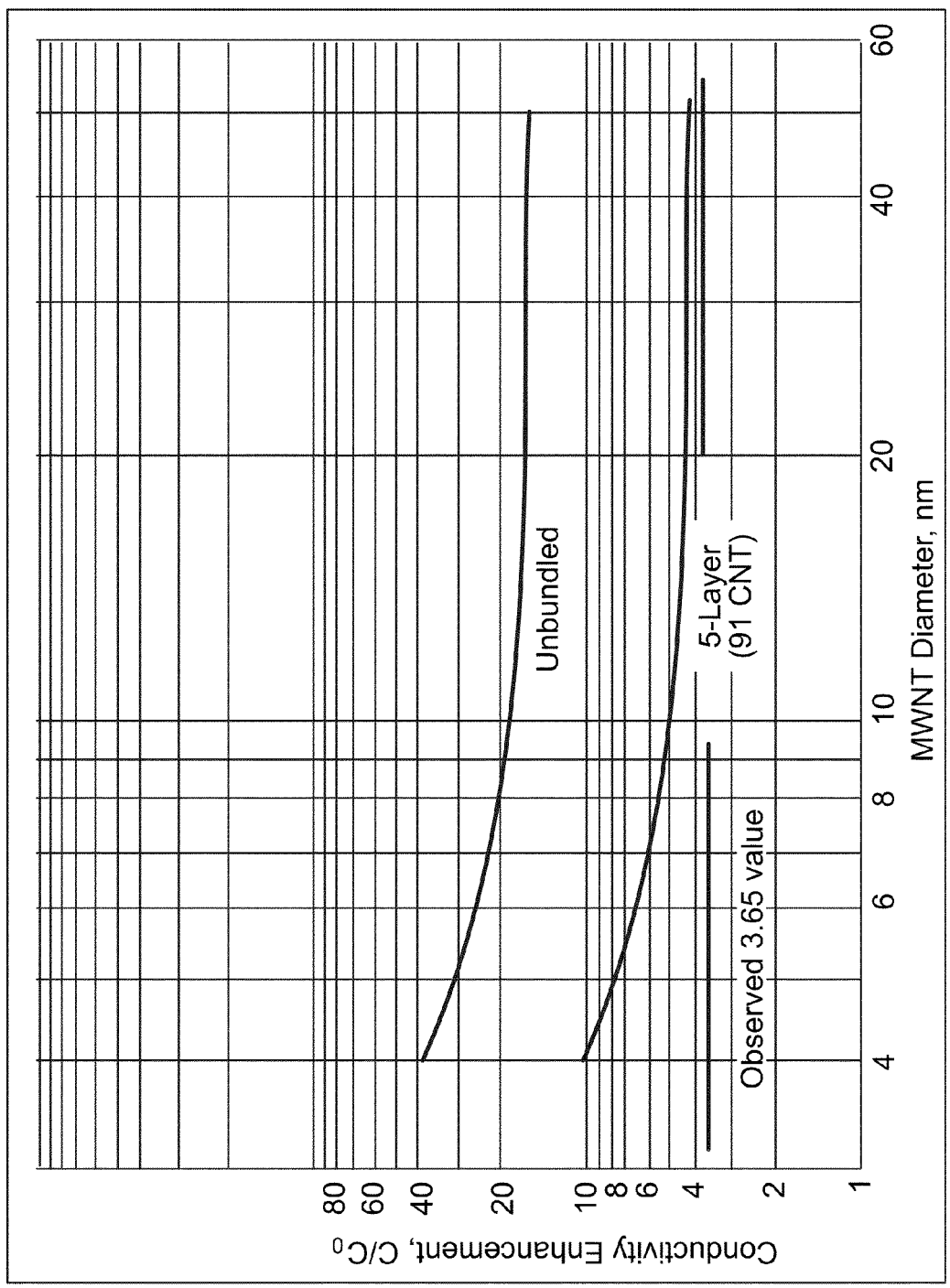
FIG. 9 is a graph of the predicted conductivity enhancement ($C/C_o$) resulting from bromine doping of multi-wall carbon nanotube (MWNT) yarn with bromine for bundled and unbundled MWNT, plotted as a function of MWNT diameter.

FIG. 9 is a graph of the predicted conductivity enhancement ($C/C_o$) as a function of multi-wall carbon nanotube (MWNT) diameter resulting from doping of MWNT yarn with bromine for bundled and unbundled MWNT. The data in this graph was obtained using, on the one hand, 10-wall nanotubes bundled and arranged in a 5-layer configuration and, on the other hand, unbundled MWNT.

For 4 nm diameter MWNTs, the predicted conductivity enhancements ($C/C_o$) for the two materials (unbundled, and bundled 10-wall nanotubes in a 5-layer configuration) are respectively approximately 39 and approximately 12.

For 50 nm diameter MWNTs, the predicted conductivity enhancements ($C/C_o$) for the two materials (unbundled, and bundled 10-wall nanotubes in a 5-layer configuration) are respectively approximately 15 and approximately 3.65.

As indicated by the reference line in FIG. 9, a conductivity enhancement factor of at least approximately 3.65 is observed with bromine-doped bundled 10-wall CNT in a 5-layer configuration arrangement.

The disclosed post-synthesis CNT treatment procedure permits controlled adjustment of the conductivity of CNT powders and manufactured films, yarns, cables and sheet materials so as to increase the conductance of the conductor element to a desired value. While a conductivity enhancement factor ($C/C_o$) of 3.65 was demonstrated in some tests with CNT yarns, conductivity enhancement ($C/C_o$) factors of at least approximately forty may be possible with other CNT materials according to embodiments of the invention. For example, conductivity enhancement factors of at least approximately forty may be possible with one of unbundled single-wall carbon nanotube (SWNT) and unbundled MWNT with diameters ranging from 4 nm to 50 nm.

The experimental results obtained can be used to estimate the maximum conductivity enhancement ($C/C_o$) that may be possible with $Br_2$ doping of different diameter CNT. The only necessary assumptions are that the conductivity of undoped CNT is independent of tube diameter and that the maximum conductivity enhancement occurs with monolayer $Br_2$ film coverage. An expression can be derived for the maximum conductivity enhancement factor ($C/C_o$), with the assistance of expressions for the specific surface area of bundled and unbundled CNT derived by Peigney et al. ("Specific surface area of carbon nanotubes and bundles of carbon nanotubes," *Carbon* Vol. 39, p. 507 (2001)).

The maximum conductivity enhancement ($C/C_o$) achievable with bromine doping of multi-wall carbon nanotube (MWNT) yarn may be expressed as a function of MWNT diameter, number of tube walls and bundle layering by the equation:

$$\frac{C}{C_0} = \frac{98}{1 - \frac{Z \cdot f}{Y}}$$

$$Z = 0.143 \cdot (MW_{Br})^{1/3} \cdot \rho_{Br}^{2/3}$$

$$Y = n \cdot d - 0.84 \cdot n \cdot (n-1)$$

f=$N_{equiv}$/N where $N_{equiv}$=the number of MWNT's with a specific surface equal to that of a bundle comprising N tubes, N=the actual number of MWNTs in the bundle, $MW_{Br}$ equals the molecular weight of bromine, $\rho_{Br}$ equals the density of liquid bromine, n equals the number of tube walls, and d equals the diameter of the conductor element.

As may be seen from the results summarized in Table 1, significant differences exist in the dependence of conductivity enhancement ($C/C_o$) on dopant concentration for doping of CNT yarn using, according to embodiments of the invention, a dopant that is one of chloroauric acid ($HAuCl_4$) and bromine ($Br_2$).

As can be seen in Table 1 and FIG. 8, treating the CNT yarn according to embodiments of the invention with a bromine vapor dopant produces no early enhancement saturation effect but instead brings about a conductivity enhancement ($C/C_o$) that increases with dopant exposure time in a linear fashion up to a maximum of approximately 3.65 at a 3.1 atom percent Br concentration, the maximum Br dopant level that was studied.

On the other hand, treating CNT yarn according to embodiments of the invention with a doping solution comprising 0.02 to 5M $HAuCl_4$ produces a nearly constant 1.8× conductivity enhancement ($C/C_o$) irrespective of dopant solution concentration.

According to embodiments of the invention, chloroauric acid and bromine dopants are absorbed at and/or affect different CNT surface sites, with Br-susceptible sites outnumbering Au-treatable sites. The maximum 3.65× enhancement factor observed for the CTex CNT yarn samples is consistent with values expected, as shown in FIG. 9, for 20-40 nm diameter 10-wall nanotubes arranged in a 5-layer bundle configuration according to embodiments of the invention.

Energy Dispersive X-ray Analysis (EDX) results reveal a low and nearly constant 0.4 atom percent Au in the doped yarn samples. This shows a saturation effect in which gold atoms are only deposited or bound at certain sites or defect areas on the CNT.

Similar doping treatments were conducted according to embodiments of the invention, using dopants comprising one of concentrated hydrochloric (HCl) acid and concentrated hydroiodic (HI) acid, thereby generating a conductivity enhancement. These treatments resulted in a somewhat lower level of conductivity enhancement ($C/C_o$) of at least approximately 1.3. Accordingly, for embodiments of the invention wherein the dopant comprises one of hydrochloric acid and hydroiodic acid, the conductivity may be enhanced by a factor of at least approximately 1.3.

Analysis of the HCl-doped and HI-doped yarns showed the yarns to contain similarly low levels of Cl and I, with respective atom percents of 0.20 and 0.55.

The different behavior observed between, on the one hand, a $Br_2$ dopant and, on the other hand, acid dopants ($HAuCl_4$, HCl and HI) suggests that these two classes of dopants have two different CNT conductivity enhancement mechanisms. $HAuCl_4$ and other acid dopants may react with or associate with tube edges or defect areas where electron densities may be elevated or localized due to different chemical bonding hybridization. Such electron-rich areas may serve as reducing sites for $AuCl_4^-$ ions, leading to deposition of Au atoms at these sites and an increase in positive hole carrier concentrations. The doping saturation effect can be explained by the fact that such defect or edge sites tend to be limited in number, as can the modest conductivity enhancement ($C/C_o$) obtained.

However, with $Br_2$ and possibly other halogen dopants, the doping agent can diffuse into the tube bundles, can penetrate the exohedral regions around CNT, and can be adsorbed onto the CNT surfaces, thereby effectively increasing the electron carrier concentration. Accordingly, the conductivity enhancement ($C/C_o$) should be much higher since a larger area of the CNT may be doped.

The correctness of this conclusion is bolstered by the fact that a sequential doping treatment of CNT yarn samples yields a conductivity enhancement ($C/C_o$) larger than either dopant produces by itself. CNT yarn is first doped with $HAuCl_4$, and is then doped for one hour with $Br_2$. This dual treatment causes an overall conductivity enhancement ($C/C_o$) of 3.0, which is larger than would result from either doping treatment performed by itself.

According to embodiments of the invention, a method includes the steps of receiving a conductor element formed from a plurality of carbon nanotubes; and exposing the conductor element to a controlled amount of a dopant so as to increase the conductance of the conductor element to a desired value, wherein the dopant comprises chloroauric acid, wherein the dopant further comprises bromine, and wherein the two dopants are applied sequentially.

According to embodiments of the invention, conductivity is thereby enhanced by a factor greater than the enhancement factor produced by a dopant comprising chloroauric acid.

According to embodiments of the invention, conductivity is thereby enhanced by a factor greater than the enhancement factor produced by a dopant comprising bromine.

Figure 10:
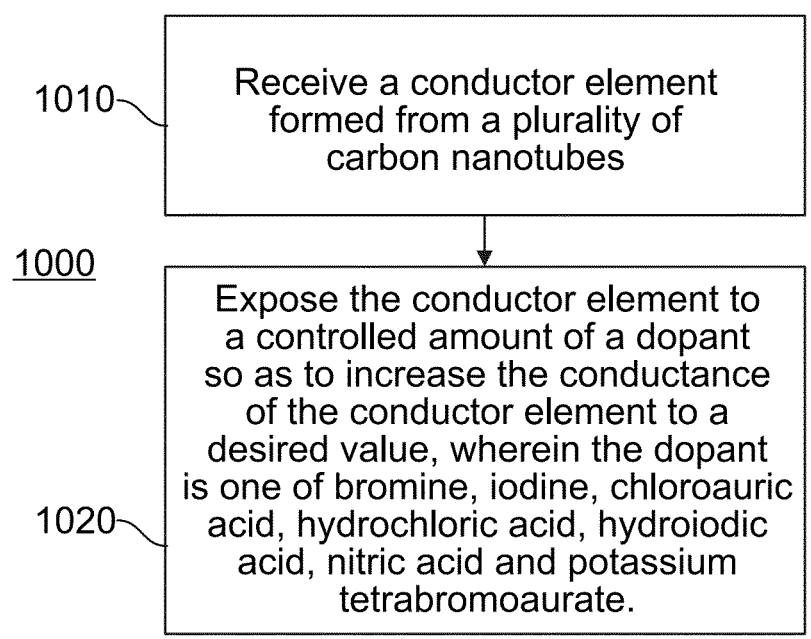
FIG. 10 is a flowchart of a method for creating a CNT conductor with enhanced electrical conductivity.

FIG. 10 is a flowchart of a method 1000 for creating a CNT conductor with enhanced electrical conductance. The order of the steps in the method 1000 is not constrained to that shown in FIG. 10 or described in the following discussion. Several of the steps could occur in a different order without affecting the final result.

In block 1010, a conductor element formed from a plurality of carbon nanotubes is received. Block 1010 then transfers control to block 1020.

In block 1020, a conductor element is exposed to a controlled amount of a dopant so as to increase the conductance of the conductor element to a desired value, wherein the dopant is one of bromine, iodine, chloroauric acid, hydrochloric acid, hydroiodic acid, nitric acid, and potassium tetrabromoaurate. Block 1020 then terminates the process.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain fabrication steps and certain components can be altered without substantially impairing the functioning of the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the appended claims. It is intended, therefore, that the subject matter in the above description shall be interpreted as illustrative and shall not be interpreted in a limiting sense. The invention is defined by the following claims.

We claim:

1. A method, comprising the steps of:
receiving a conductor element formed from a plurality of multi-wall carbon nanotubes; and
exposing the conductor element exohedrally to a controlled amount of a dopant so as to increase the conductance of the conductor element to a desired value,
wherein the dopant comprises bromine, wherein the maximum conductivity is enhanced by a factor ($C/C_0$) that may be expressed by the equation:

$$\frac{C}{C_0} = \frac{98}{1 - \frac{Z \cdot f}{Y}}$$

$$Z = 0.143 \cdot (MW_{Br})^{1/3} \cdot \rho_{Br}^{2/3}$$

$$Y = n \cdot d - 0.84 \cdot n \cdot (n-1)$$

$f = N_{equiv}/N$ where $N_{equiv}$=the number of MWNT's with a specific surface equal to that of a bundle comprising N tubes, N=the actual number of MWNTs in the bundle, $MW_{Br}$ equals the molecular weight of bromine, $\rho_{Br}$ equals the density of liquid bromine, n equals the number of tube walls, and d equals the diameter of the conductor element.

2. A method, comprising the steps of:

receiving a conductor element formed from a plurality of multi-wall carbon nanotubes; and exposing the conductor element exohedrally to a controlled amount of a dopant so as to increase the conductance of the conductor element to a desired value, wherein the dopant comprises bromine, wherein the maximum conductivity is enhanced by a factor ($C/C_0$) that may be expressed by the equation:

$$\frac{C}{C_0} = \frac{98}{1 + \frac{Z \cdot f}{Y}}$$

$$Z = 0.143 \cdot (MW_{Br})^{1/3} \cdot \rho_{Br}^{2/3}$$

$$Y = n \cdot d - 0.34 \cdot n \cdot (n-1)$$

$f = N_{equiv}/N$ where $N_{equiv}$=the number of MWNT's with a specific surface equal to that of a bundle comprising N tubes, N=the actual number of MWNTs in the bundle, $MW_{Br}$ equals the molecular weight of bromine, $\rho_{Br}$ equals the density of liquid bromine, n equals the number of tube walls, and d equals the diameter of the conductor element, wherein an approximately linear relationship exists between the conductivity enhancement ($C/C_o$) and the percentage of bromine dopant according to the equation: ($C/C_o$)=1+0.93*% Br, where % Br is the atomic percentage of bromine dopant.

3. A method, comprising the steps of:

receiving a conductor element formed from a plurality of multi-wall carbon nanotubes; and exposing the conductor element exohedrally to a controlled amount of a dopant so as to increase the conductance of the conductor element to a desired value, wherein the dopant comprises bromine, wherein the maximum conductivity is enhanced by a factor ($C/C_0$) that may be expressed by the equation:

$$\frac{C}{C_0} = \frac{98}{1 + \frac{Z \cdot f}{Y}}$$

$$Z = 0.143 \cdot (MW_{Br})^{1/3} \cdot \rho_{Br}^{2/3}$$

$$Y = n \cdot d - 0.34 \cdot n \cdot (n-1)$$

$f = N_{equiv}/N$ where $N_{equiv}$=the number of MWNT's with a specific surface equal to that of a bundle comprising N tubes, N=the actual number of MWNTs in the bundle, $MW_{Br}$ equals the molecular weight of bromine, $\rho_{Br}$ equals the density of liquid bromine, n equals the number of tube walls, and d equals the diameter of the conductor element, wherein an approximate power-law relationship exists between the conductivity enhancement ($C/C_o$) and the time for which the conductor is exposed to the dopant according to the equation: ($C/C_o$)=1+0.97*$t^{0.14}$, where time t is expressed in minutes.

* * * * *